United States Patent [19]

Johnson

[11] Patent Number: 5,003,248
[45] Date of Patent: Mar. 26, 1991

[54] PROBABILITY DENSITY HISTOGRAM DISPLAY

[75] Inventor: Dana L. Johnson, Colorado Springs, Colo.

[73] Assignee: Hewlett-Packard Company, Palo Alto, Calif.

[21] Appl. No.: 539,285

[22] Filed: Jun. 15, 1990

Related U.S. Application Data

[63] Continuation of Ser. No. 463,909, Jan. 10, 1990, abandoned, which is a continuation of Ser. No. 262,269, Oct. 21, 1988, abandoned, which is a continuation of Ser. No. 928,940, Nov. 10, 1986, abandoned.

[51] Int. Cl.$^5$ ..................... G01R 13/20; G01R 23/16; G09G 1/06
[52] U.S. Cl. ............................. 324/121 R; 324/77 A; 340/722; 364/487
[58] Field of Search .................. 324/121 R, 77 A; 364/487, 579, 580; 340/720, 721, 722, 754

[56] References Cited

U.S. PATENT DOCUMENTS

| | | | |
|---|---|---|---|
| 4,072,851 | 2/1978 | Rose | 364/487 |
| 4,495,585 | 1/1985 | Buckley | 340/754 |

OTHER PUBLICATIONS

IBM Research Development, May 1971, pp. 204-212; A. A. Guido et al.: "Automatic Pulse Parameter Determination with the Computer Augmented Oscilloscope System", *pp. 205, 210, FIGS. 3, 10*.
IEEE, "Pulse Measurement and Analysis by Objective Techniques", Section 4.3.1, Standard 181-1977.
Fred D. Rampey, Art Porter and Mike Karin, "1-GHz Digital Scope Keeps a Close Watch on Subnanosecond Logic", Oct. 18, 1984, Electronic Design.
Ed Evel, "Digital Oscilloscope is Quick on the Trigger to Nab Elusive Glitches", Oct. 31, 1984, Electronic Design, pp. 247-256.
Art Porter, "Sampling Sees Skinny Signals", Jan. 7, 1985, Electronics Week, pp. 41-44.
Bruce Webster, "A Simple Windowing System", Mar., 1986, Byte, pp. 129-133.
"Statistical Analysis of Waveforms and Digital Time-Waveform Measurements", Application Note 93, Hewlett Packard Company, Feb. 1969, pp. 3-5.
Sapankevych et al; "Measurement . . . ", Electronics; Sep. 22, 1981; vol. 54; No. 19; pp. 113-120.
Ganesan et al; "A Real-Time . . . "; IEEE Transactions on Industrial Electronics; vol. IE-29; No. 1; Feb. 1982; pp. 73-82.
Tektronix Catalog; Tektronix Inc., Beaverton, Ore.; 1971; pp. 137-139.

*Primary Examiner*—Ernest F. Karlsen
*Attorney, Agent, or Firm*—Christopher J. Byrne

[57] ABSTRACT

Disclosed is a probability density histogram display for a digital oscilloscope which shows a probability density histogram display of an input signal waveform alongside the conventional voltage-versus-time time-domain display of the waveform. The histogram shows the relative frequency of occurrence of voltage amplitude levels of the waveform. The histogram is optional and shown simultaneously with the time-domain display of the waveform.

1 Claim, 6 Drawing Sheets

PROBABILITY DENSITY HISTOGRAM DISPLAY

This application is a continuation of Ser. No. 07/453,909, filed Jan. 10, 1990, now abandoned, which is a continuation of Ser. No. 07/262,269, filed Oct. 21, 1988, now abandoned, which is a continuation of Ser. No. 06/928,940; filed Nov. 10, 1986, now abandoned.

BACKGROUND OF THE INVENTION

A digital oscilloscope is used to capture, analyze and display electronic signal waveforms. The digital oscilloscope samples the voltage amplitude of an input signal and performs an analog-to-digital conversion (ADC) of the voltage values of the acquired samples. The digitized information is stored in memory and then used to create the display of the input signal's waveform on a cathode ray tube (CRT) display screen. Conventionally, the oscilloscope display is one of voltage-versus-time where units of voltage amplitude are plotted along the vertical axis and units of time are plotted along the horizontal axis. Typically, a wide selection of both voltage and time scale ranges is available to the user. The conventional voltage-versus-time plot may be regarded as a time-domain display of the input signal waveform. The time-domain display provides the user with critical phase and frequency information for a given input signal waveform.

The time-domain display, however, does not provide a complete display of the waveform. In particular, the relative frequency of occurrence of waveform voltage amplitude levels is not readily discernible in the time-domain. Determining the frequency of occurrence of amplitude levels is critical for several reasons. For instance, in pulse waveform analysis it is necessary to determine the base and top magnitudes, that is, amplitude levels, of the pulse. The base and top magnitudes of a pulse provide amplitude information used to establish the distal, mesial, and proximal lines. These lines typically designate the 90 percent, 50 percent and 10 percent values, respectively, of the pulse amplitude. These values are used extensively in timing analysis. For instance, the risetime of a pulse is defined as the amount of time required for the pulse to rise from 10 percent to 90 percent of its final amplitude value.

A standardized technique for determining the base and top magnitudes of a pulse waveform requires the computation and analysis of a probability-density histogram of the pulse data. (This standardized technique is described in the Institute of Electrical and Electronic Engineers (IEEE) Standard 181-1977, Section 4.3, entitled *Pulse Measurement and Analysis by Objective Techniques.*) The probability-density histogram is essentially an analytical bar-chart giving the frequency of occurrence of amplitude levels. The probability-density histogram may be regarded as a probability-domain analysis of a waveform in contrast to the conventional voltage-versus-time time-domain display of an oscilloscope. Conventionally, the probability-domain analysis, if performed, is invisible to the user of the oscilloscope.

SUMMARY OF THE INVENTION

The present invention makes the probability-domain histogram analysis visible to the digital oscilloscope user with a probability-density histogram display. The probability-density histogram display is a bar-chart showing the frequency of occurrence of voltage(amplitude) levels of a given input signal waveform. As a visual display, the histogram allows the viewer to determine, at a glance, the relative probability that a waveform occupies a given voltage amplitude level. The present invention allows the user the option of viewing the waveform in the time-domain and probability-domain simultaneously. The time-domain display is the conventional voltage(amplitude)-versus-time display. The probability-domain display is a voltage(amplitude)-versus-probability display, where the probability axis is simply a scale of numerical values between zero and one. Hence, the histogram shows the probability that the waveform occupies a voltage(amplitude) level measured along the voltage(amplitude) axis. In the preferred embodiment of the present invention, the probability-domain display is adjacent to the time-domain display and configured such that the voltage(amplitude) axis in the time-domain is parallel and identical to the voltage(amplitude) axis in the probability-domain. Moreover, the distal and proximal lines, that is, the 90 percent and 10 percent lines, are shown as dashed horizontal lines across the displays of both domains.

There are significant advantages to viewing a signal waveform in the probability-domain and time-domain simultaneously. First, the oscilloscope user gains important insight into how the top and base amplitudes, and hence the distal and proximal lines, are computed for particular waveforms. For instance, the histogram technique, that is, IEEE Standard 181-1977, is generally very reliable except for waveforms without significant durations at the top and base magnitudes. For these exceptional waveforms, reliance on the histogram analysis may adversely affect the accuracy and repeatability of measurements. A quick view of the waveform's histogram, that is, a view of the waveform in the probability-domain, will alert the user to those waveforms which lack significant durations at the top and base magnitudes. The user may then take corrective action to improve the measurement such as rewindowing the data so that the top and base can be more accurately determined or overriding automatic distal and proximal line computation with user-entered data. Secondly, waveform distortions may be more obvious in the probability-domain. For instance, ideal periodic waveforms, such as sine waves, triangular waves, square waves and so on, have characteristic histograms. For such waveforms, irregularities which are unobvious in the time-domain are quite detectable in the probability-domain. For example, the probability-density histogram for a perfect triangle wave is essentially a straight horizontal bar. Whereas slight non-linearities in the ramps of the triangle wave may be undetectable in the time-domain, such non-linearity will appear as a distinct glitch in the histogram. The histogram for such a triangle wave will also be dipped, where it would otherwise be straight, in direct proportion to the degree of non-linearity in the time-domain.

Hence, the optional, simultaneous probability-density histogram allows the oscilloscope user increased waveform measurement confidence and provides immediate visual alerts to subtle waveform distortions which may otherwise go undetected.

DESCRIPTION OF THE PREFERRED EMBODIMENT

Figure 1:
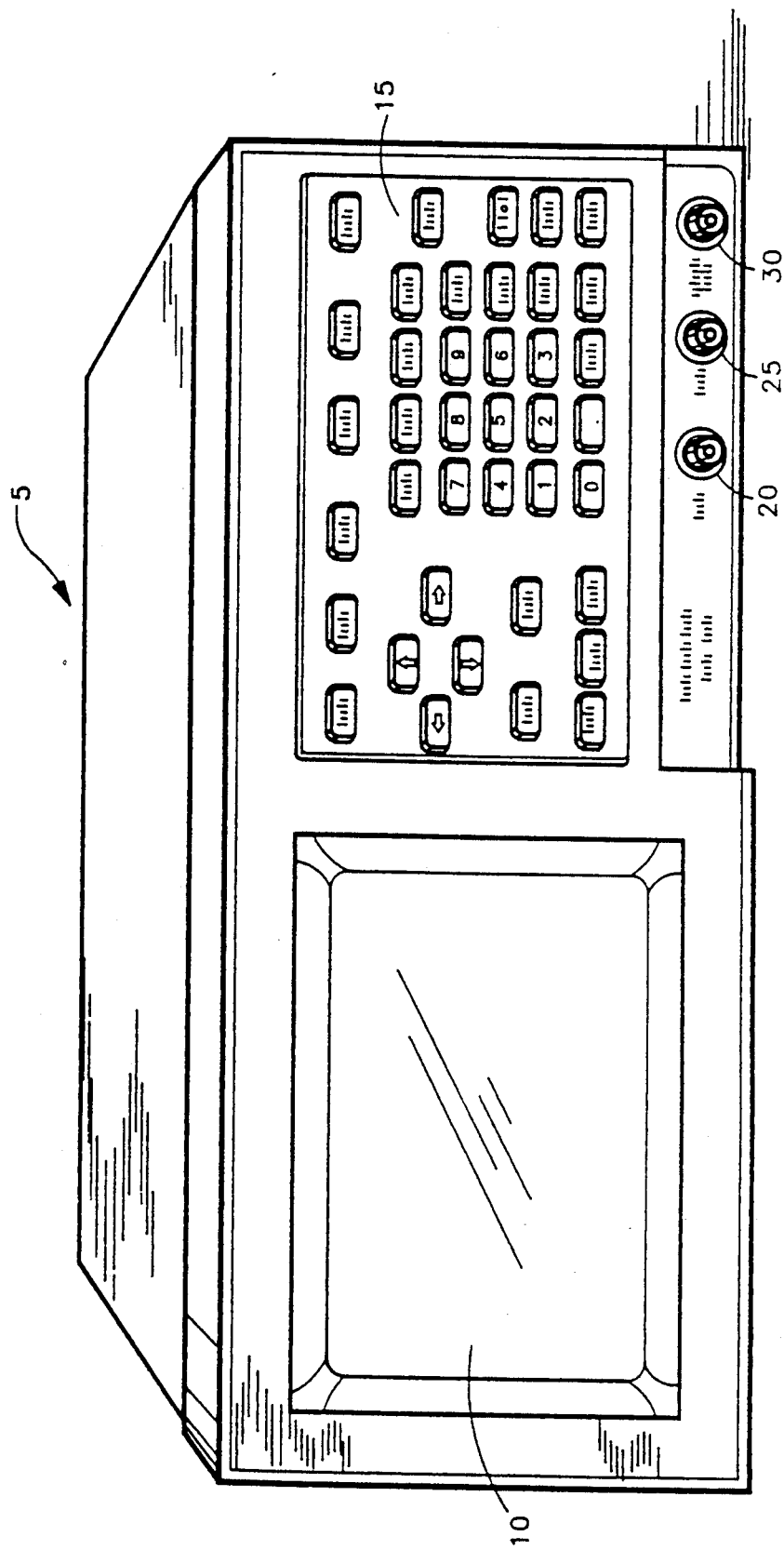
FIG. 1 shows a general overview of a digital oscilloscope.

FIG. 1 is a general overview of digital oscilloscope 5 such as may incorporate the present invention. Oscilloscope 5 is operated and controlled by the user with menu keyboard 15. Trigger signals for reference and input signals for display are received at ports 20, 25 and 30. Input signal waveforms are viewed on display screen 10.

Figure 2:
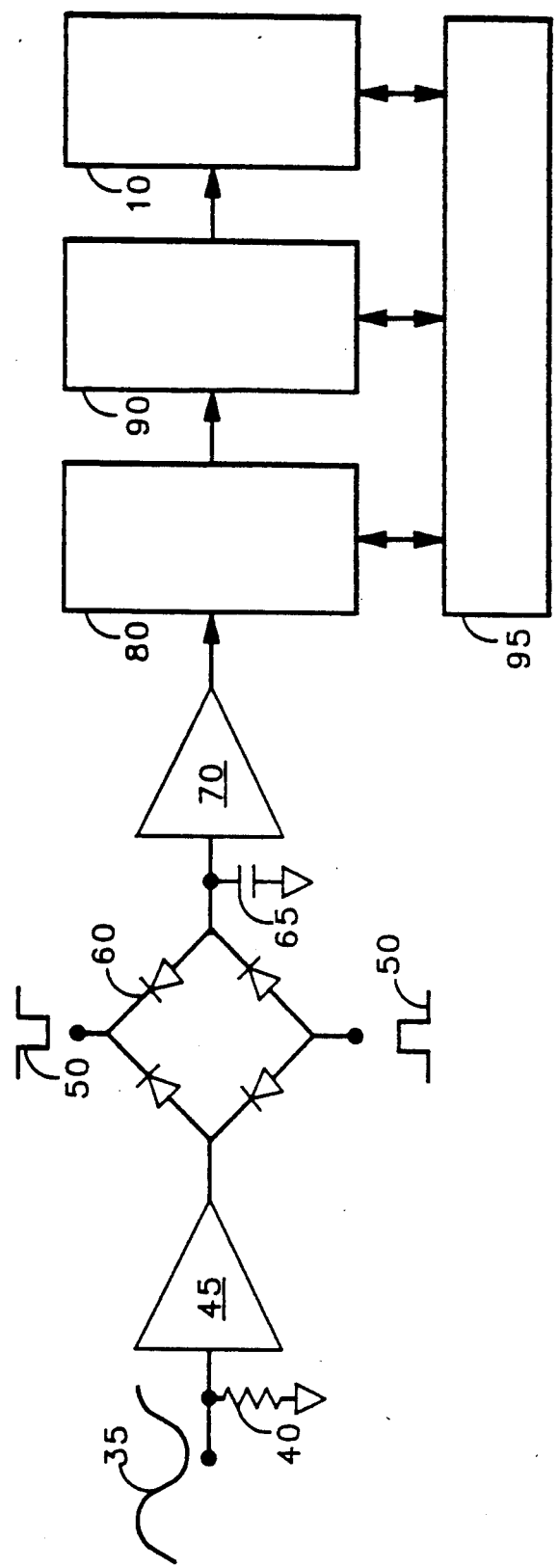
FIG. 2 shows a functional diagram of the digital oscilloscope of FIG. 1.

FIG. 2 is a functional overview of digital oscilloscope 5. Sensing circuit 40 detects input signal 35. Signal 35 is buffered by pre-amp 45 and applied to sampling bridge 60. Sample-clock pulse 50 drives sampling bridge 60 in such a way that a sample of the voltage value of input signal 35 is passed on to holding circuit 65 with each period of sample-clock 50. Post-amp 70 then delivers the voltage values from holding circuit 65 to analog-to-digital converter 80 (ADC). ADC 80 converts the sample voltage values to digital words such that each signal sample is represented by a single digital word. The digitized samples produced by ADC 80 are stored in memory 90. The digitized information can be analysed in the computation of the probability-density histogram. This digital information is mapped from memory 90 to display screen 10 to create a display of the probability-density histogram of the waveform of signal 35. Control circuitry 90 governs the interaction of ADC 80, memory 90 and display screen 10.

Figure 3:
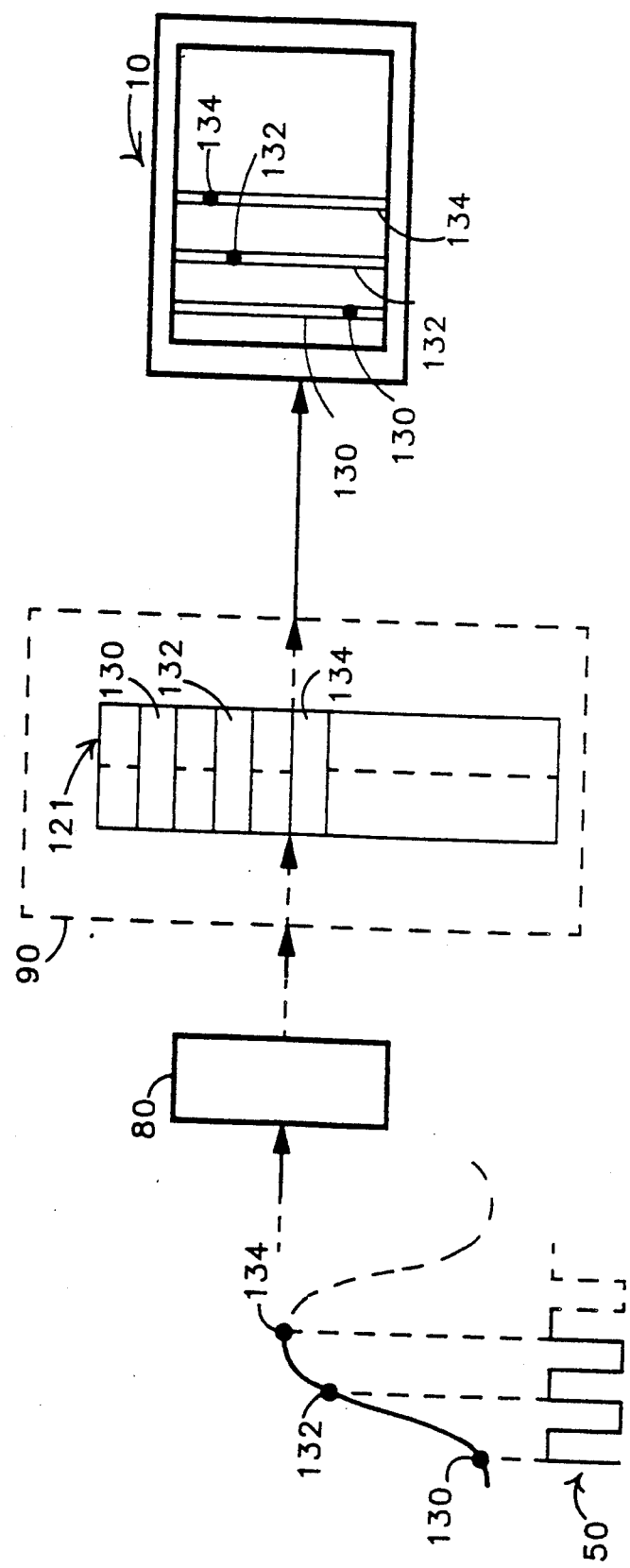
FIG. 3 shows the sampling of an input signal and the storage and display of the digitized sample information.

FIG. 3 shows the sampling of an input signal 35 and the storage and display of the digitized information. Input signal 35 is sampled on the rising edge of each pulse of sample-clock 50. Typical signal amplitude values 130, 132, and 134 are digitized by ADC 80 and stored in waveform buffer 121 in locations 130M, 132M and 134M, respectively. Locations 130M, 132M and 134M are implemented as 8-bit digital words in waveform buffer 121. The sample data may then be mapped from waveform buffer 121 locations 130M, 132M, and 134M to corresponding display screen 10 locations 130DS, 132DS and 134DS, respectively. Display screen 10 locations may be implemented as pixel cells.

Figure 4:
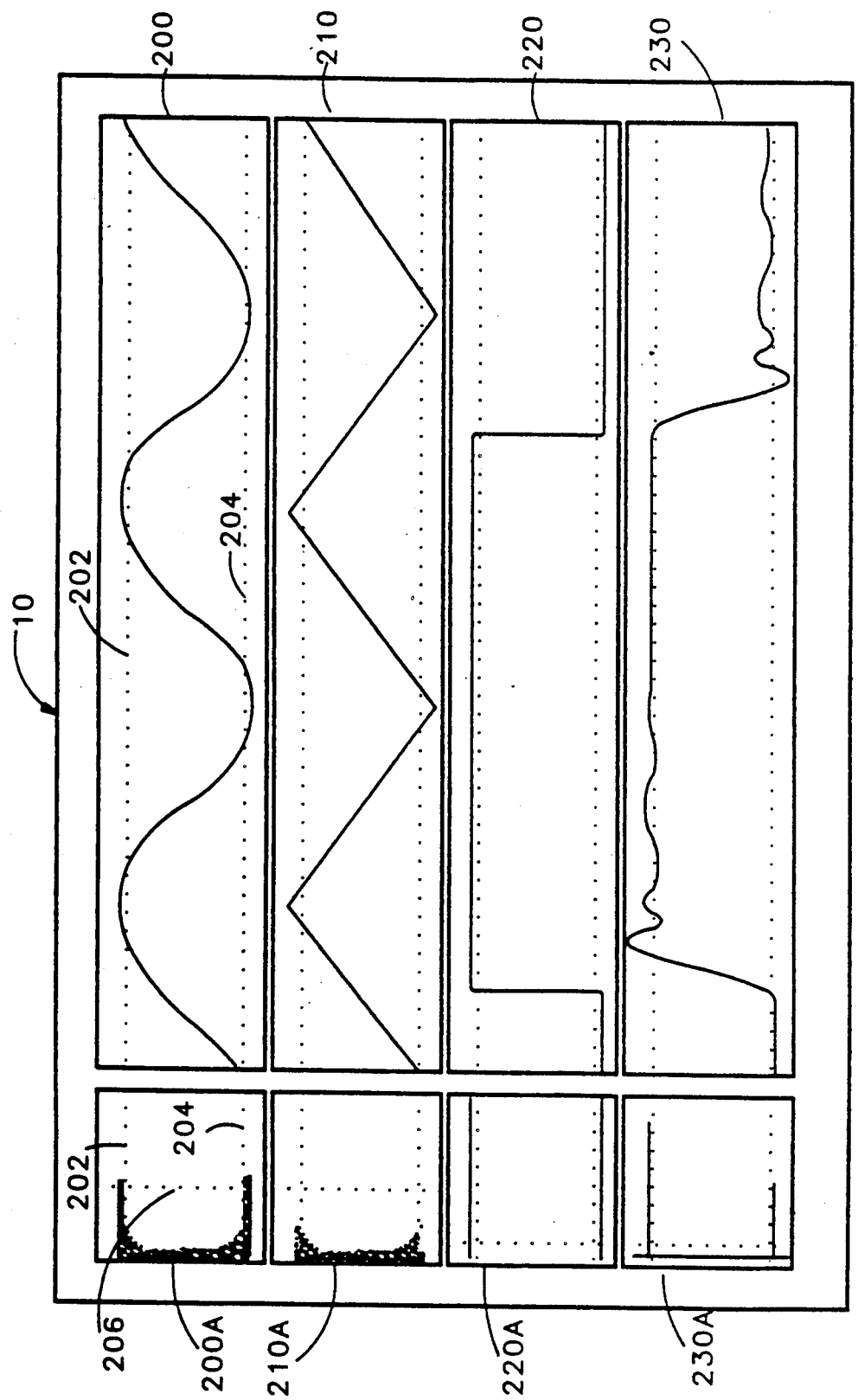
FIG. 4 shows a sample display of the present invention.

FIG. 4 shows a sample display of the present invention. In the preferred embodiment of the present invention, display screen 10 can accommodate a plurality of windows. This allows for the simultaneous display of four input signals. In the preferred embodiment of the present invention, the time-domain display of an input signal is shown on the right-hand side of display screen 10 and its corresponding probability-domain display is shown adjacently to the left of the time-domain display. A sine wave is shown in time-domain display 200 and its corresponding probability-domain display 200A is adjacent to the left. Likewise, a triangle wave is shown in time-domain display 210 and its corresponding probability-domain display 210A is adjacent to the left. Likewise, probability-domain display 220A corresponds to the pulse in time display 220 and probability-domain display 230A corresponds to the noisy pulse of time-domain display 230. In the preferred embodiment of the present invention, as shown in FIG. 4, the probability-domain and time-domain displays for a single waveform are adjacent and configured such that the voltage(amplitude) axis in the probability-domain display is identical and parallel to the voltage(amplitude) axis in the time-domain display. As shown in FIG. 4, the voltage(amplitude) axis is the vertical axis in both the probability and the time domain. The horizontal axis in the time-domain measures time. The horizontal axis in the probability-domain is a scale of numerical values between zero and one, indicating degree of probability between zero percent and one-hundred percent, respectively. The time-domain displays 200, 210, 220, and 230 provide phase and frequency information for their respective waveforms while probability-domain displays 200A, 210A, 220A, and 230A provide probability-density histograms. The histograms indicate the frequency of occurrence of voltage(amplitude) levels of their corresponding time-domain waveforms. Hence, the length of a horizontal bar at a given voltage(amplitude) level in a probability-domain display indicates the probability, between zero and one-hundred percent, that the waveform shown in the adjacent time-domain display occupies that voltage(amplitude) level. In the preferred embodiment of the present invention, the distal and proximal lines, that is, the 90 percent and 10 percent lines, are shown as dashed horizontal lines in both the probability-domain and the time-domain, such as distal line 202 and proximal line 204 in time-domain 200 and probability-domain 200A. In all cases, the voltage(amplitude) level of the distal and proximal lines in a given time-domain will match the levels of the distal and proximal lines in the corresponding probability-domain because the domains have identical voltage(amplitude) axes. In addition, the count threshold is shown as a dashed vertical line in each probability-domain, such as count threshold line 206 in probability-domain 200A. The count threshold is simply a predetermined percentage of all the sample points in waveform buffer 121, such as ten percent. The count threshold defines the minimum number of points in waveform buffer 121 which must equal or exceed a given voltage(amplitude) level before that level can be candidate for the top or base magnitude of a given waveform.

Figure 5B:
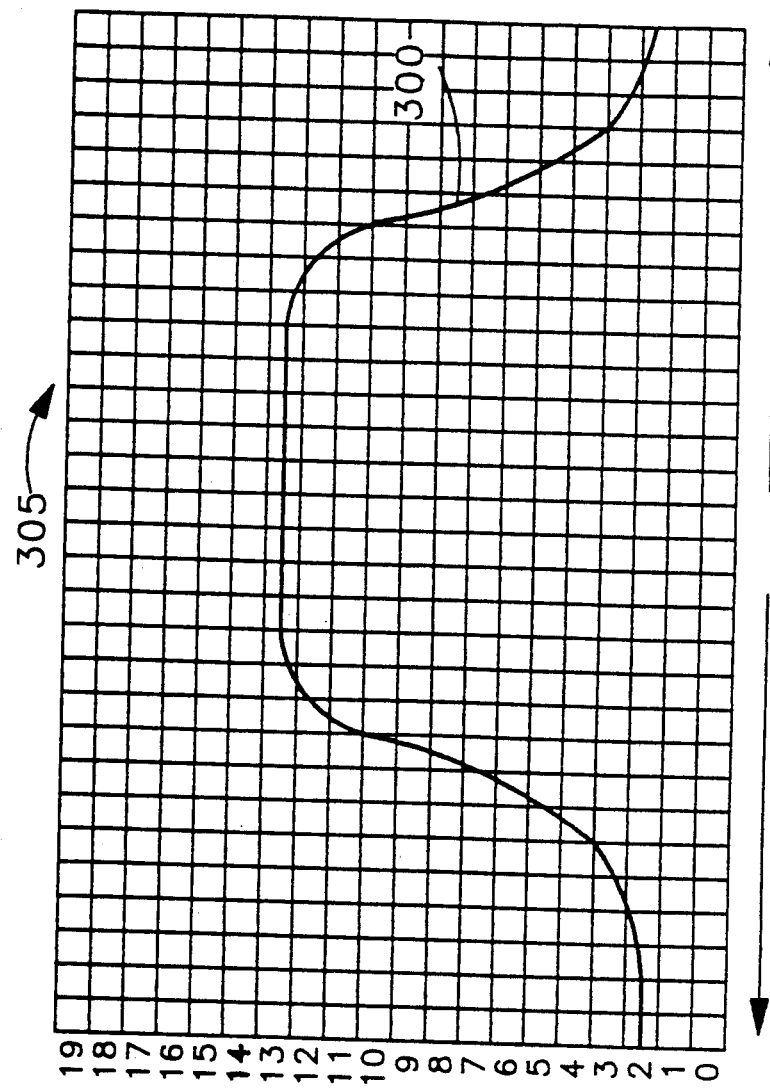
FIG. 5 shows a graphical depiction of the construction of the probability-density histogram.
Figure 5A:
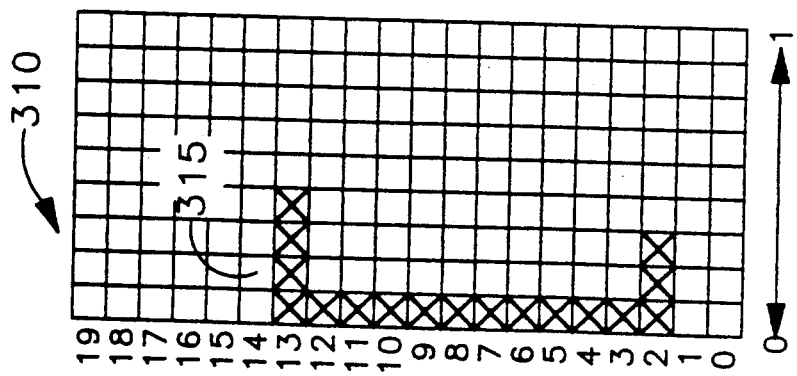

FIG. 5 is graphical depiction of the construction of the probability-density histogram. Pulse waveform 300 may be graphically superimposed on gridded time-domain 305. Time-domain display 305 has a vertical voltage(amplitude) axis and a horizontal time axis. Probability-domain 310 is adjacent to the left of time-domain 305. Probability-domain 310 has a vertical voltage(amplitude) axis and a horizontal probability axis, that is, the horizontal axis is simply a scale of numeral values between zero and one. The voltage(amplitude) axis of probability-domain 310 is indentical to the voltage(amplitude) axis of time-domain 305. Probability-density histogram 315 in probability-domain 310 corresponds to waveform 300 in time-domain 305. Histogram 315 indicates the frequency of occurrence of voltage(amplitude) levels for waveform 300. Histogram 315 is constructed as follows. At each voltage(amplitude) level in time-domain 305, a count is made of the number of grid squares that waveform 300 intersects across the time-domain at that level. At the corresponding voltage(amplitude) level in probability-domain 310, a proportionate number of grid squares are marked. Since the vertical voltage(amplitude) axes are identical, the proportionate relationship between the counts in time-domain 305 and the number of marked squares in probability-domain 310 is simply the ratio of the horizontal lengths of each domain, as measured in grid squares. In FIG. 5, the ratio is 3:1 such that at each voltage(amplitude) level, three squares in time-domain 305 correspond to one square in probability-domain 310. For instance, at voltage(amplitude) level 13, waveform 300 intersects twelve squares in time-domain 305; therefore, four squares are marked at level 13 in probability domain 310. Likewise, at level 6, waveform 300 intersects only two squares in time-domain 305, so that at most only one square is marked at level 6 in probability-domain 310. Likewise, at level 2, waveform 300 intersects nine squares in time-domain 305 so that three squares are marked in probability-domain 310 at level 2. Similar calculations at each voltage(amplitude) level result in construction of probability-domain histogram 310. The graphical concept of FIG. 5 is discussed in Section 4.3.1 of IEEE Standard 181-1977, entitled *Pulse Measurement and Analysis by Objective Techniques.*

Figure 6B:
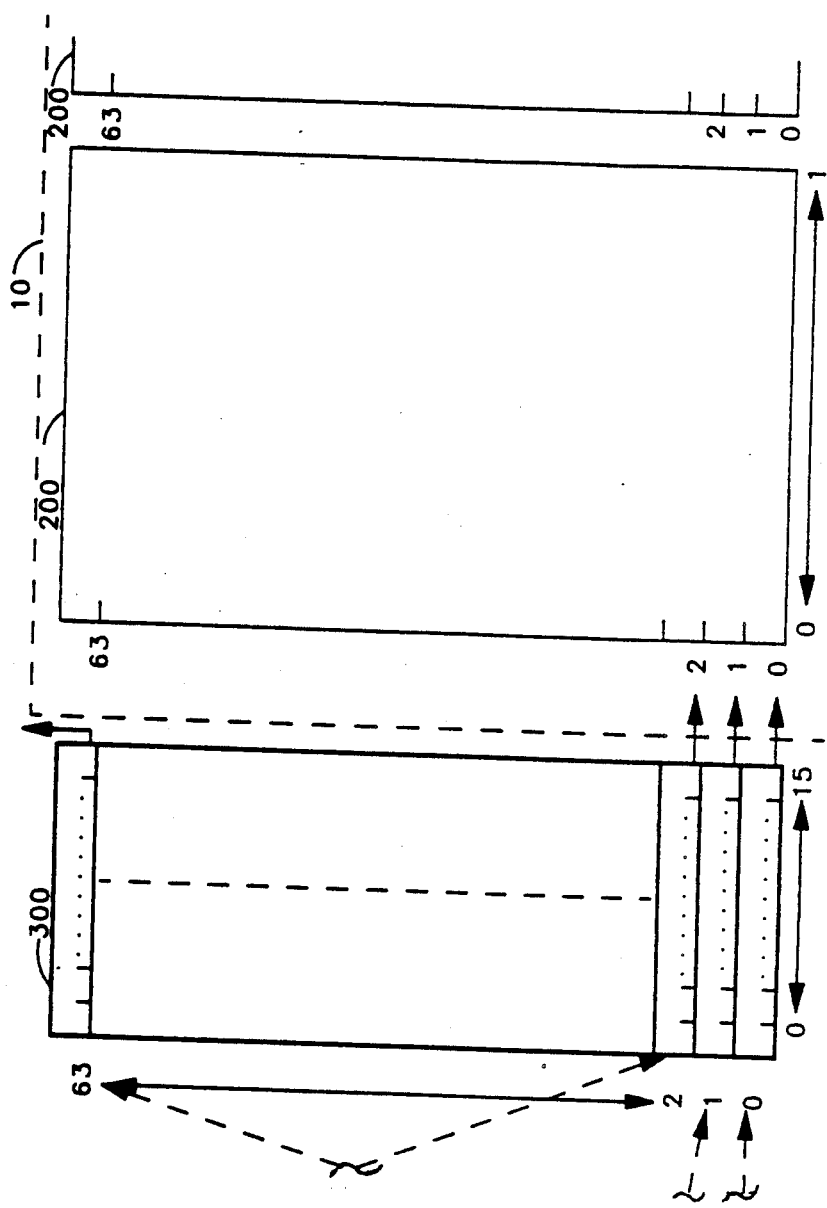
FIG. 6 shows how the conceptual teaching of FIG. 5 is implemented in the present invention.
Figure 6A:
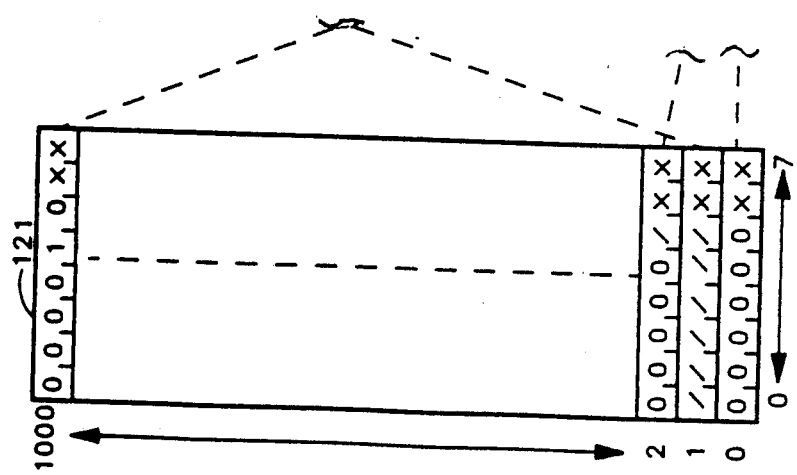

FIG. 6 shows how the conceptual teaching of FIG. 5 is implemented in the present invention. The digitized sample values stored in the bytes of waveform buffer 121 constitute a digital representation of the input signal waveform. Each byte is a single point. In the preferred embodiment of the present invention, the digital value of a point represents the amplitude of a sample. The ordinal position of the point in waveform buffer 121 corresponds to that sample's time, that is, its position in the time-domain.

Since each point is an 8-bit byte, the amplitude value of a point is resolvable into $2^8 = 256$ levels. In the preferred embodiment of the present invention, only the six most significant bits of resolution are used, producing $2^6 = 64$ levels. Hence, the voltage(amplitude) axis of both the probability-domain and the time-domain displays is resolvable into sixty-four discrete voltage(amplitude) levels. A bank 300 of sixty-four 16-bit counters provides a 16-bit counter for each (voltage)amplitude level. Prior to filling waveform buffer 121 with sample data, the counters are cleared. Then waveform buffer 121 is filled with sample data and then read, one point at a time. For each of the sixty-four possible voltage(amplitude) levels per point, the appropriate corresponding counter in bank 300 is incremented. For instance, as shown in FIG. 6, if the six most significant bits of point #0 in waveform 121 contain the digital value zero, then counter #0 in bank 300 is incremented; if the six most significant bits of point #1 contain the value sixty-three, then counter #63 is incremented; if the six most significant bits of point #2 contain the value one, then counter #1 is incremented; and so on throughout the 1001 points of waveform buffer 121. If a value occurs more than once in waveform buffer 121, then the counter correpsonding to that value is incremented each time that value occurs. For instance, suppose that points #100 through #700 of the 1001 locations of waveform buffer 121 each contained the value forty-eight, while the remaining points contained the value sixteen, as might be the case with a long duty-cycle pulse, similar to the pulse in time-domain 220 of FIG. 4. In such a case, counter #48 in bank 300 would be incremented $(700-100)+1=601$ times; counter #16 would be incremented $(1001-601)=400$ times; and the remaining counters would remain zeroed. (Since each counter has sixteen bits, each counter may be incremented $2^{16}=65,536$ times. However, since ther are only 1001 locations in waveform buffer 121, the highest count value any counter will contain, in the preferred embodiment, is 1001. The extra resolution of the counters allows for growth in the length of the waveform buffer.) When all the locations of waveform buffer 121 have been read and the corresponding 16-bit counters have been incremented, the histogram for that particular waveform is essentially contained in bank 300. In display of the histogram, the final incremented value of each of the sixty-four counters corresponds directly to the horizontal length of the bar-element of the histogram at the corresponding voltage(amplitude) level on the display. In mapping the digital information of bank 300 onto probability-domain display 200A, conventional horizontal auto-scaling is employed to ensure, at any of the sixty-four voltage amplitude levels, that the largest count value of any of the sixty-four counters corresponds to the longest horizontal histogram bar-element. Auto-scaling thus ensures that all of the information in bank 300 is mapped onto the probability-domain display to produce an image that best represents the shape of the probability domain distribution of points, that is, the probability-density histogram.

I claim:

1. A digital oscilloscope for acquiring and displaying information about an electronic input signal to said oscilloscope, said information to be presented in both the time-domain and the probability-domain simultaneously on a display-screen of said oscilloscope, said oscilloscope comprising:

a first means for displaying, in said time-domain, said input signal as a voltage-versus-time waveform within a distinctly demarcated first portion of said display-screen of said oscilloscope; and a second means for displaying, in said probability-domain, within a distinctly demarcated second portion of said display-screen, a probability-density histogram, said histogram showing the relative frequency of occurrence of the voltage amplitude levels of said voltage-versus-time waveform, said histogram viewable simultaneously with said voltage-versus-time waveform;

said oscilloscope being configured such that a user of said oscilloscope can adjust acquisition of said input signal in response to information obtained from visually comparing the probability-domain display with the time-domain display of said input signal.

* * * * *